United States Patent [19]

Yamashita et al.

[11] Patent Number: 4,996,700
[45] Date of Patent: Feb. 26, 1991

[54] IRRADIATION EQUIPMENT FOR APPLYING SYNCHROTRON RADIATION

[75] Inventors: Yoshimi Yamashita, Sagamihara; Kei Horiuchi, Zama, both of Japan

[73] Assignee: Fujitsu Limited, Kawasaki, Japan

[21] Appl. No.: 441,616

[22] Filed: Nov. 27, 1989

[30] Foreign Application Priority Data

Dec. 8, 1988 [JP] Japan .................. 63-310422

[51] Int. Cl.$^5$ .................. G21K 1/00; G21K 1/04; H05H 7/00
[52] U.S. Cl. .................. 378/145; 378/160; 328/235
[58] Field of Search .............. 378/160, 161, 119, 145, 378/147, 150; 328/235

[56] References Cited

U.S. PATENT DOCUMENTS 4,748,646  5/1988  Osada et al. .................. 378/119
4,769,829  9/1988  Webb et al. .................. 378/147

FOREIGN PATENT DOCUMENTS

A3806950  9/1989  Fed. Rep. of Germany .

OTHER PUBLICATIONS

Nuclear Instruments and Methods in Physics Research, vol. 222, 1984, pp. 345–346, Amsterdam, NL; R. Tatchyn et al.: "A UHV Chopper Design for SSRL". Nuclear Instruments and Methods in Physics Research, vol. A-246, 1986, pp. 41–44, Amsterdam, NL; E. S. Gluskin et al.: "First Experiments with SR from the 75 KG Superconducting Wiggler on the VEPP-2M Storage Ring".
European Search Report—EP 89 12 2557.

Primary Examiner—Janice A. Howell
Assistant Examiner—Don Wong
Attorney, Agent, or Firm—Staas & Halsey

[57] ABSTRACT

Irradiation equipment comprising a beam duct disposed along the synchrotron radiation beam, and a multistage axial flow turbine installed in the beam duct. The multistage axial flow turbine comprises a plurality of stators and rotors arranged alternately in an axial direction. Each stator has vanes and a beam transmission hole formed through the vane region. Each rotor has vanes and gaps between adjacent vanes. A plurality of beam transmission holes are aligned in a direction of the synchrotron radiation beam, and a plurality of gaps of the rotors are intermittently aligned in the direction of the synchrotron radiation beam, whereby the synchrotron radiation beam can intermittently penetrate through the multistage axial flow turbine through the beam transmission holes and gaps with rotation of the rotor.

24 Claims, 5 Drawing Sheets

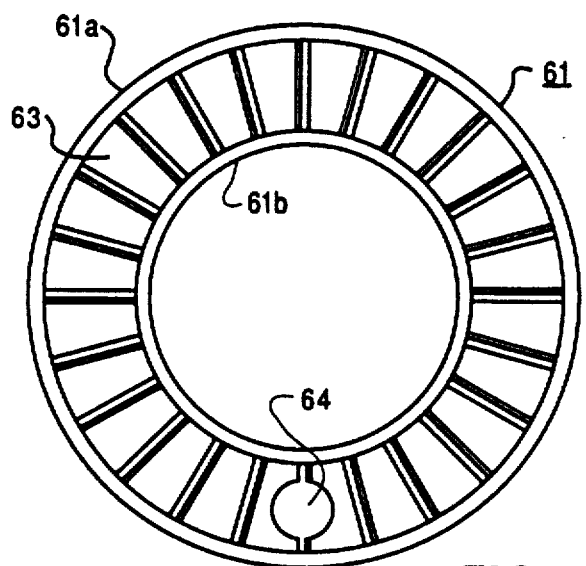
FIG.4(a)  FIG.4(b)
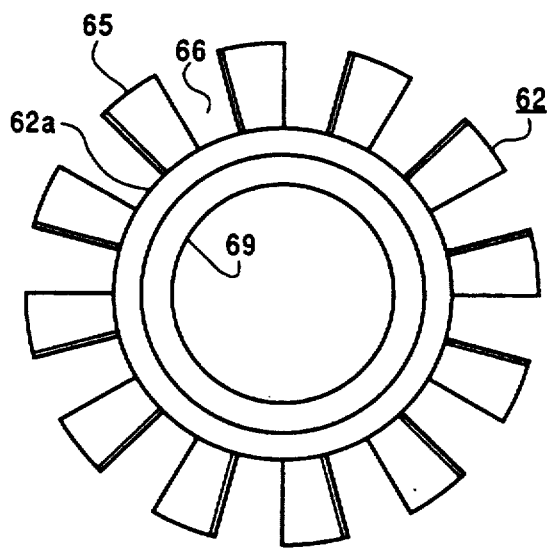
FIG.5(a)  FIG.5(b)

IRRADIATION EQUIPMENT FOR APPLYING SYNCHROTRON RADIATION

BACKGROUND OF THE INVENTION

1. Field of the Invention

The present invention relates to irradiation equipment used for applying synchrotron radiation. More particularly, the present invention relates to irradiation equipment that has a short beam duct length, is easy to handle and has a high efficiency in irradiating synchrotron radiation having a wide range of wavelength.

In recent years, increasing numbers of synchrotrons have been used in research and development. Electrons accelerated along a circular orbit in a ring-shaped synchrotron radiate so-called synchrotron radiation through irradiation equipment and into a work chamber.

2. Description of the Related Art

Synchrotron radiation has attracted considerable attention in many fields, such as the field of lithography technology and the field of semiconductor process technology. Because synchrotron radiation is irradiated from the synchrotron, which has a high vacuum, for example higher than $10^{-9}$ to $10^{-10}$ Torr, the irradiation equipment must have a high vacuum at an inlet side thereof. However, an exit side of the irradiation equipment is connected to the work chamber, which is normally at a low vacuum or atmospheric pressure.

In a first case of existing irradiation equipment, a beam duct is sealed with a beryllium (Be) window at the exit side of the irradiation equipment. The synchrotron radiation is irradiated through the Be window and into the work chamber. The pressure of the work chamber for this first case is determined depending on the synchrotron radiation being applied and can be, for example, from atmospheric pressure to a low vacuum of $10^{-1}$ to $10^{-2}$ Torr.

In a second case of existing irradiation equipment, the work chamber is directly connected to the end of the beam duct without the Be window. In this case, the pressure of the work chamber is determined based upon an overall exhaust capacity of the irradiation equipment. As a result, the work chamber is, for example, at a pressure of about $10^{-6}$ to $10^{-7}$ Torr.

In existing irradiation equipment, a plurality of vacuum systems are connected in cascade and form a differential exhaust system. These vacuum systems connect the irradiation equipment to the synchrotron, which has a high vacuum. Each vacuum system comprises a beam duct, an exhaust pump, a gate valve and an aperture plate.

FIG. 1 shows a schematic structure of existing irradiation equipment for applying synchrotron radiation. In FIG. 1, a synchrotron radiation beam 1 is injected into an inlet of a beam line 3 from a synchrotron 2. The synchrotron radiation beam 1 progresses along the beam line 3 and is output through a Be window 31 that seals the right end of the beam line 3. In this case, the work chamber and the subject to be irradiated are disposed outside the Be window and are, therefore, at atmospheric pressure.

The beam line 3 comprises a plurality of vacuum systems, each comprising an aperture plate 33 ($33_1$ to $33_n$) having a center beam transmission hole 32, a gate valve 34 ($34_1$ to $34_n$), an exhaust duct 35 ($35_1$ to $35_n$) and pumps (not shown). The vacuum systems collectively form a differential exhaust system. The beam line 3 not only transmits the synchrotron radiation beam 1, but also suppresses gas molecules from flowing toward the high vacuum inlet side from the low vacuum outlet side. The Be window 31 that seals the end of the beam line 3 must have a high synchrotron radiation transmissivity and a high mechanical strength.

Existing irradiation equipment for applying synchrotron radiation has many drawbacks including the following problems. Because the aperture plates 33 that divide the beam line 3 into a plurality of sections and prevent the gas molecules from moving toward the high vacuum inlet side have beam transmission holes 32, overall exhaust efficiency is reduced. That is, the beam transmission holes 32 form a bypass for the differential exhaust system and reduce the overall exhaust efficiency. Even when the end portion of the beam line 3 sealed by the Be window 31 is evacuated to a pressure of about $10^{-6}$ to $10^{-7}$ Torr, the total length of the differential exhaust system is longer than 10 meters.

Also, when the synchrotron radiation beam having a wavelength range between a few angstroms to several tens of angstroms is required, which is a wavelength range widely used in a lithography process of semiconductors, attenuation of the beam by the Be window 31 can not be ignored. In order to reduce the attenuation, the thickness of Be window 31 is preferably reduced to be less than 50 microns. However, a Be window 31 having a thickness of less than 50 microns cannot withstand the pressure difference between the atmospheric pressure of the work chamber and the vacuum ($10^{-6}$ to $10^{-7}$ Torr) at the beam exit end portion of the irradiation equipment.

When the wavelength of the synchrotron radiation beam is longer than several tens of angstroms, the attenuation in the Be window 31 increases still further. In this case, a Be window 31 cannot be used. As a result, the work chamber should be directly coupled to the beam line 3. This requires that the pressure in the work chamber be $10^{-6}$ to $10^{-7}$ Torr. Because of this vacuum in the work chamber, the subject for irradiation in the work chamber cannot be handled easily.

SUMMARY OF THE INVENTION

It is an object of the invention to provide irradiation equipment for applying synchrotron radiation without a Be window separating a work chamber from irradiation equipment.

It is another object of the invention to provide irradiation equipment for applying synchrotron radiation in which a multistage axial flow turbine is utilized along a beam line.

It is still another object of the invention to provide irradiation equipment for applying synchrotron radiation in which the substantial number of vacuum systems in existing irradiation equipment are eliminated and the length of the irradiation equipment is made shorter.

It is a further object of the invention to provide irradiation equipment for applying synchrotron radiation in which the synchrotron radiation beam is effectively utilized regardless of its wavelength.

It is still a further object of the invention to provide irradiation equipment which is easy to handle.

To achieve the above and other objects, the present invention provides a system that can be coupled to the synchrotron at one end and can be arranged along the beam line of synchrotron radiation. The irradiation equipment comprises a multistage axial flow turbine arranged along the beam line. This turbine has an inlet and outlet for the synchrotron radiation beam located apart from a central axis of the turbine and has a plurality of stators and rotors. Each stator and rotor has vanes that are arranged alternately in the axial direction. Each stator has a hole formed in the vane region. The hole of each stator is aligned with those of the other stators in the axial direction. Each rotor has gaps between the vanes, and the respective gaps of corresponding rotors are aligned in the axial direction. The irradiation equipment of the present invention enables the synchrotron radiation beam to penetrate from the inlet to the outlet of the turbine via the holes and gaps with rotation of the rotor.

BRIEF DESCRIPTION OF THE DRAWINGS

FIGS. 4(a) and 4(b) are respectively a plan view and a schematic side view of a stator of the multistage axial flow turbine in accordance with the present invention;

FIGS. 5(a) and 5(b) are respectively a plan view and a schematic side view of a rotor of the multistage axial flow turbine in accordance with the present invention;

DETAILED DESCRIPTION OF THE PREFERRED EMBODIMENTS

Figure 1:
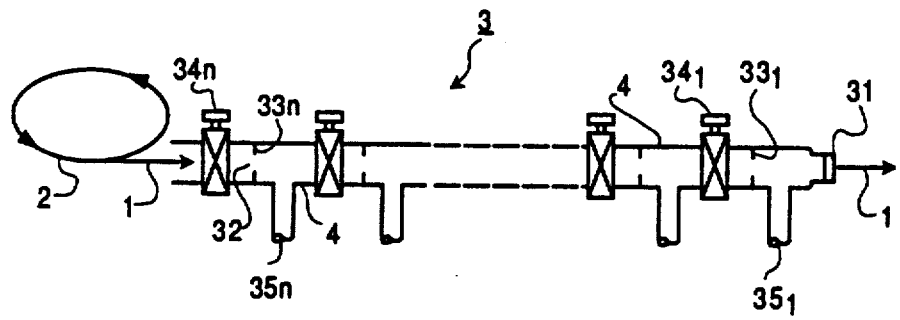
FIG. 1 is a schematic diagram of existing irradiation equipment.
Figure 2A:
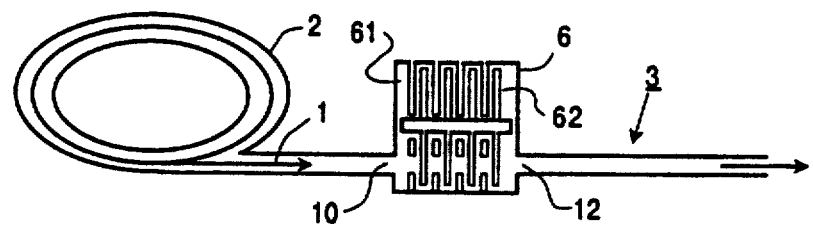
FIG. 2(a) is a schematic diagram of irradiation equipment embodying the present invention.

FIG. 2(a) is a schematic diagram of irradiation equipment embodying the present invention. In FIG. 2(a), irradiation equipment comprises a multistage axial flow turbine 6 provided along a beam line 3. A synchrotron 2 accelerates electrons along a circular orbit. The accelerated electrons move at close to the light speed and radiate synchrotron radiation, which advances along the beam line 3. As shown in FIG. 2(a), a multistage axial flow turbine 6 has an inlet 10 and an outlet 12 provided in a casing of the multistage axial flow turbine 6. The positions of the inlet 10 and outlet 12 are offset from the center axis of the turbine 6. The multistage axial flow turbine 6 may also be referred to as a turbomolecular pump or turbo pump.

The multistage axial flow turbine 6 comprises a plurality of stators 61 and rotors 62. In the multistage axial flow turbine 6 of the present invention, each stator 61 has a beam transmission hole and each rotor 62 has a gap between adjacent vanes thereof. When the beam transmission holes in the stators 61 and gaps between vanes of rotors 62 are aligned along a line that is parallel to the center axis of the turbine 6 and coincident with a line connecting the inlet 10 to the outlet 12, the synchrotron radiation beam 1 penetrates or travels unobstructed along the beam line 3. The penetrating synchrotron radiation beam may be utilized in many irradiation applications, for example, in a semiconductor lithography process.

Figure 2B:
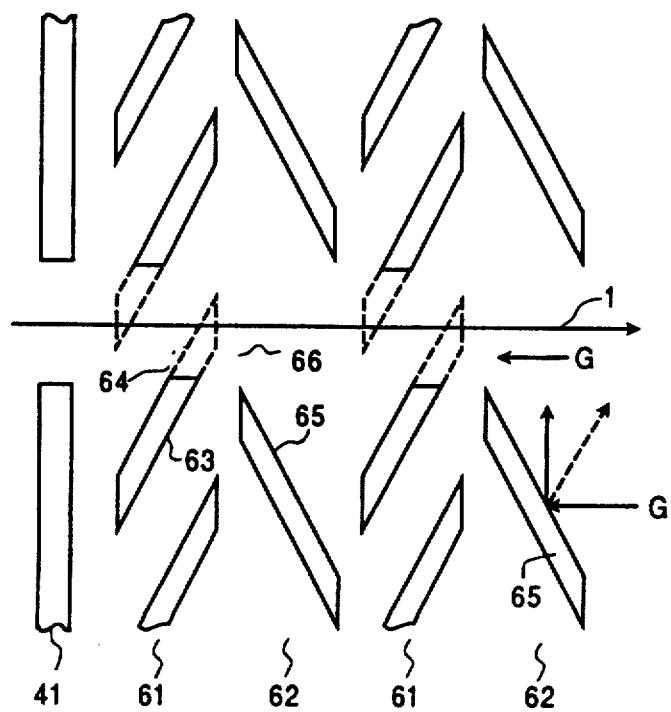
FIG. 2(b) is a partial cross section of vanes of stators and rotors of a multistage axial flow turbine in accordance with the present invention.

The stators 61 and rotors 62 are arranged alternately in the axial direction. The center of the rotors 62 are fixed to the rotatable axis of the multistage axial flow turbine 6. FIG. 2(b) is a partial cross section of vanes of stators 61 and rotors 62. The beam transmission hole 64 is formed in the vanes 63 of the stator 61. Gaps 66 are formed between two adjacent vanes 65 of the rotors 62. When a plurality of beam transmission holes 64 and gaps 66 are aligned along a line that is parallel with the axis of rotation of the rotors 62, the synchrotron radiation beam 1 penetrates through the multistage axial flow turbine 6.

In FIG. 2(b), a residual gas molecule G moving from a low vacuum side toward a higher vacuum side, impinges on a vane 65 of the rotor 62 as shown by a solid arrow. Because the vane 65 is moving at a high speed in a vertical direction to the sheet as shown by a bold solid arrow, the residual gas molecule G is repelled back toward the low vacuum side as shown by a dashed arrow and the flow of gas molecules toward the high vacuum side is effectively prevented. Though some part of the gas molecules flow toward the high vacuum side through gaps 66 of rotor vanes 65, most of the gas molecules are pushed back toward low vacuum side by the successive rotors 62 in the axial direction.

Contrary to existing differential exhaust systems, the multistage axial flow turbine 6 can be installed in a limited space. Also, the multistage axial flow turbine 6, in itself, provides the functions of existing multistage exhaust systems. That is, a stator 61 and rotor 62 pair perform the function of a single stage of existing multistage exhaust systems. Therefore, a sufficiently high vacuum in the synchrotron 2 can be maintained by the increased number of exhaust stages formed by the multistage axial flow turbine 6. Even when the low vacuum side of the multistage axial flow turbine 6 is connected to the work chamber, a sufficiently high vacuum is obtained at the high vacuum side of the multistage axial flow turbine 6. A sufficiently high vacuum is obtained even if the work chamber is at atmospheric pressure or a low vacuum of $10^{-1}$ to $10^{-2}$ Torr.

The velocity of the moving gas molecules does not exceed the velocity of sound. Consequently, there is a large difference between the velocity of the gas molecules and the velocity of synchrotron radiation, which is close to the velocity light. Even when the rotor 62 is rotated at such a high speed that the residual gas molecules colliding with the rotating rotor vanes 65 are repelled backwardly, the synchrotron radiation beam is not continually interrupted due to collision with vanes 65. Although the synchrotron radiation beam 1 is intermittently blocked by the rotor vanes 65, this causes no problem in practical applications.

Figure 3:
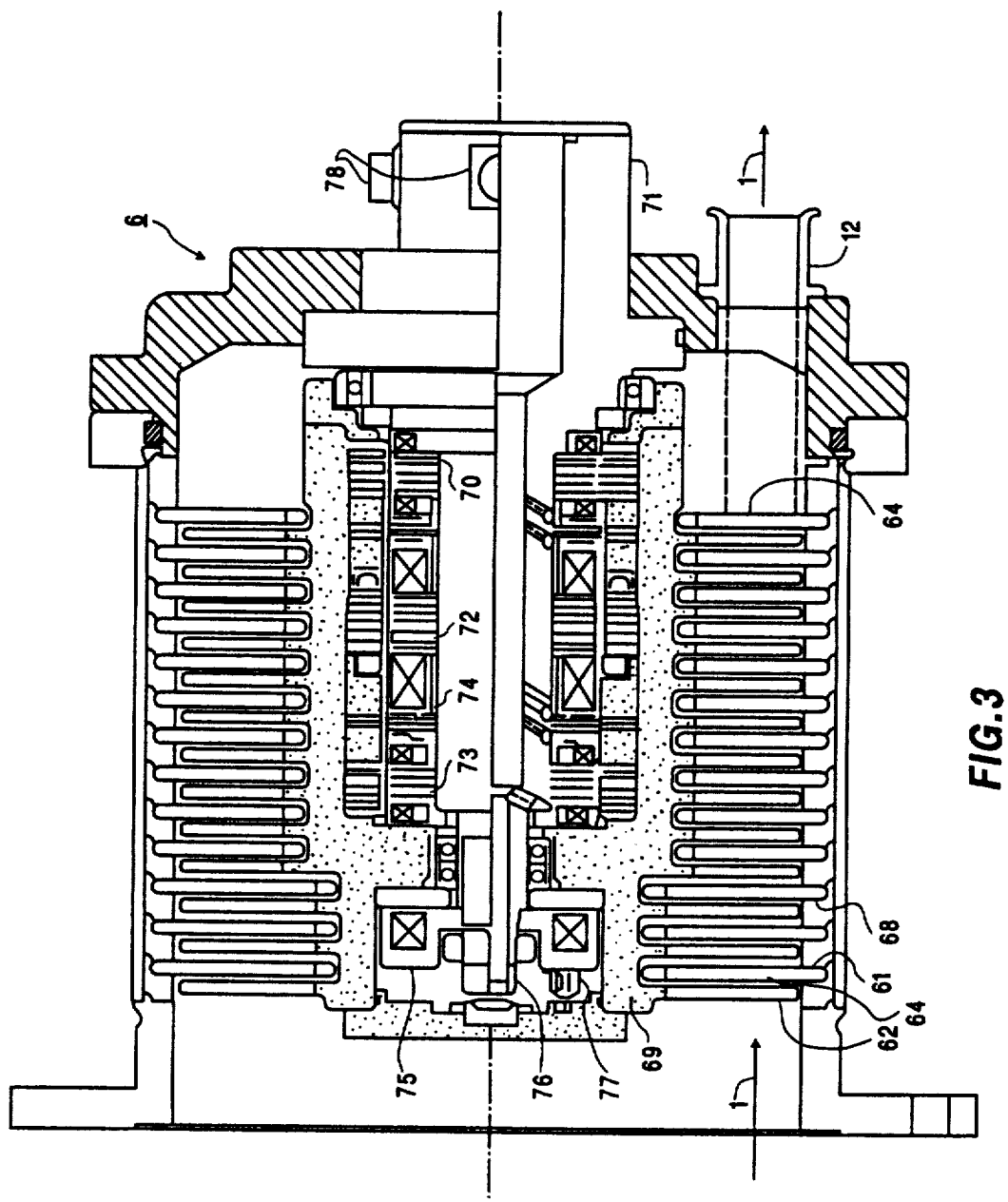
FIG. 3 is a cross section of a multistage axial flow turbine embodying the present invention.

The multistage axial flow turbine 6 utilized in the irradiation equipment of the present invention, has structure similar to that utilized in a vacuum pump except that it has been modified for transmitting the synchrotron radiation beam therethrough. The cross section of a multistage axial flow turbine 6 of the present invention is shown in FIG. 3. Plural stators 61 and rotors 62 are provided and arranged alternately in an axial direction. Each of the stators 61 and the rotors 62 has a plurality of vanes. The stators 61 are fixed to an outer casing 68 at an outside periphery, and the rotors 62 are fixed to a rotating axis 69 at an inside periphery. The rotating axis 69 is supported rotatably on a stationary fixed axis 71 via magnetic bearings 70 and 73. A high frequency motor 72 is provided between the rotating axis 69 and fixed axis 71.

In the case where the rotating axis 69 is supported on the stationary fixed axis 71 via magnetic bearings 70 and 73, and the high frequency motor 72 is provided between the rotating axis 69 and fixed axis 71, a mechanism is necessary for correctly maintaining the relative position between the rotating axis and the fixed axis. A radial position sensor 74 detects the relative radial position of the rotating axis 69 and an axial position sensor 76 detects the relative axial position of the rotating axis 69. Both of these sensors are disposed on the fixed axis 71 and maintain the correct position between the rotating axis 69 and fixed axis 71.

A position detection sensor 77 outputs a signal synchronous with rotation of the rotor 62. Connectors 78 supply electric power to the magnetic bearings 70 and 73, and to high frequency motor 72, and also pick up signals from the axial position sensor 76 and position detection sensor 77.

An outlet 12 for the synchrotron radiation is provided on the outer casing 68 of the multistage axial flow turbine 6. The beam transmission hole 64 is formed in vanes of the stator 61 at a position corresponding to the synchrotron radiation outlet 12. The synchrotron radiation beam 1 is input from the high vacuum side to the multistage axial flow turbine 6, penetrates through the gaps between vanes of the rotor 62 and the beam transmission hole 64 of the stator 61, and is output from the synchrotron radiation outlet 12.

As shown in FIG. 4(a), the stator 61 comprises an outer ring 61a, an inner ring 61b and a plurality of vanes 63. The surface of each vane 63 is fixed between outer ring 61a and inner ring 61b and has an inclination in a circumferential direction having a predetermined angle with regard to a sheet surface of the stator. The inclination of vanes 63 along the circumferential direction is shown schematically in FIG. 4(b). The beam transmission hole 64 is formed in the vane region by cutting a portion of two vanes 63.

As shown in FIG. 5(a), the rotor 62 comprises a plurality of vanes 65 fixed to an inner ring 62a at one end. A plurality of inner rings 62a having vanes that are integral as one body with the rotating axis 69. The surface of each vane that is fixed to the inner ring 62a has an inclination of a predetermined angle with regard to a direction of vane rotation. The inclination of vanes 65 is shown schematically in FIG. 5(b). A plurality of gaps 66 between vanes 65 are provided around the inner ring 62a for transmission of the synchrotron radiation beam.

Figure 6:
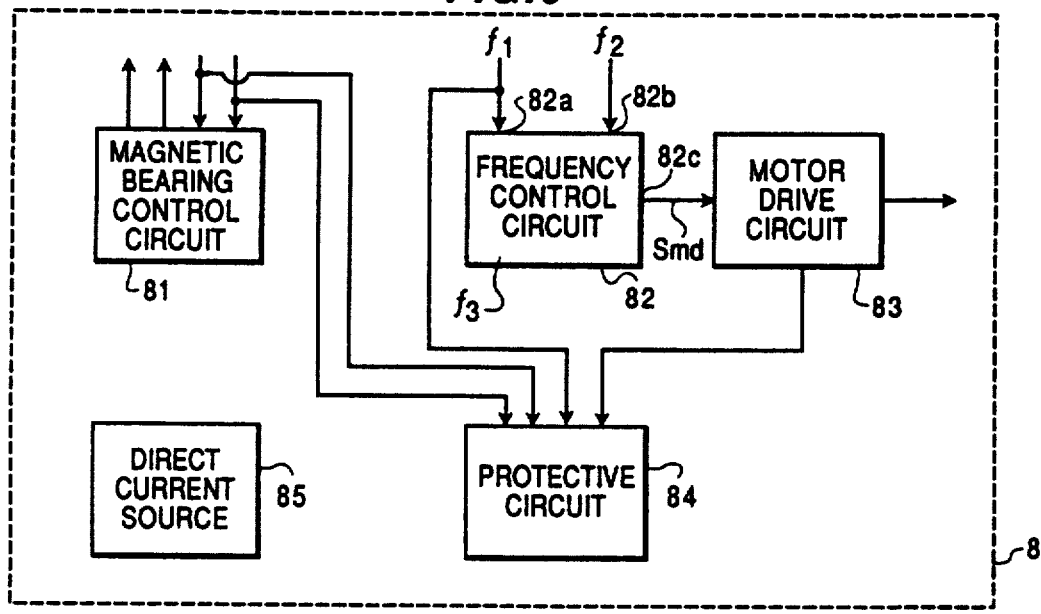
FIG. 6 is a block diagram of a control unit employed in an embodiment of the present invention.

Further, a control unit 8 is provided for driving the multistage axial flow turbine 6. A block diagram of control unit 8 is shown in FIG. 6. The control unit 8 comprises a magnetic bearing control circuit 81, a frequency control circuit 82, a motor drive circuit 83, a protective circuit 84 and a direct current source 85. The magnetic bearing control circuit 81 controls currents applied to the magnetic bearings 70 and 73, and the axial magnet 75. These currents are controlled based on signals from the radial position sensor 74 and axial position sensor 76 such that the rotating axis 69 rotates stably at a predetermined position.

The frequency control circuit 82 comprises a signal generator circuit (not shown), a first signal input terminal 82a, a second signal input terminal 82b and a signal output terminal 82c. A feedback signal $f_1$ is input into the first signal input terminal 82a from the position detection sensor 77 and is compared with either another input signal $f_2$ from the second signal input terminal 82b or a control signal $f_3$ from the signal generator circuit. This comparison results in outputting a signal Smd from a signal output terminal 82c. The signal Smd controls the speed of the multistage axial flow turbine 6, which is driven by the motor drive circuit 83.

If the multistage axial flow turbine 6 is rotating stably at a predetermined speed during operation, the control signal $f_3$ of a predetermined frequency is directly output from the signal output terminal 82c. When there is a difference between the feedback signal $f_1$ and control signal $f_3$ during operation, the signal Smd is output and will either accelerate or decelerate rotation of the multistage axial flow turbine 6 such that the difference will diminish. In the case of starting the multistage axial flow turbine 6, the control signal $f_3$ is much larger than the feedback signal $f_1$ and an acceleration signal Smd that diminishes the frequency difference is output from the signal output terminal 82c. In the case of stopping the multistage axial flow turbine 6, a deceleration signal Smd that increases the frequency difference is output from signal output terminal 82c.

The motor drive circuit 83 supplies driving current to the high frequency motor 72 of the multistage axial flow turbine 6. The driving current is controlled by the signal Smd input into motor drive circuit 83 from the frequency control circuit 82. The protective circuit 84 protects the multistage axial flow turbine 6 by monitoring signals from radial direction sensor 74, axial direction sensor 76, position detection sensor 77 and a load condition of the motor drive circuit 83. The direct current source 85 supplies the electric current necessary for these circuits (detailed connections are omitted in FIG. 6).

Figure 7:
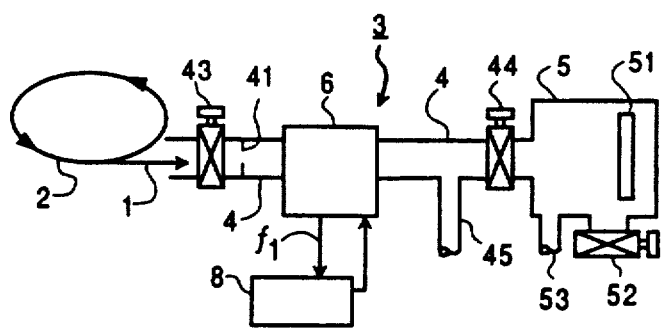
FIG. 7 is a schematic diagram of a first embodiment of irradiation equipment employing the present invention.

The first embodiment of the irradiation equipment employing the present invention is shown in FIG. 7. With reference to FIG. 7, the synchrotron radiation beam 1 from the synchrotron 2 is input into the left side of the irradiation equipment, and is applied to the work chamber 5 provided on the right side of the irradiation equipment. A target 51 for irradiation is disposed in work chamber 5. The irradiation equipment also includes a beam duct 4, which forms a main vacuum path of the beam line 3, and the multistage axial flow turbine 6, which is positioned between two portions of beam duct 4. The irradiation equipment further comprises a gate valve 43 and aperture plate 41 on the high vacuum side. The low vacuum side of the irradiation equipment includes a gate valve 44, an exhaust duct 45 and the work chamber 5 having a gate valve 52 and an exhaust duct 53. There is no Be window along the path of the synchrotron radiation beam 1. The gate valve 52 and an exhaust system (not shown) connected to the exhaust duct 53 maintain a low vacuum, for example about $10^{-1}$ to $10^{-2}$ Torr, in the work chamber 5.

In the first embodiment, a high vacuum is obtained for the synchrotron 2 by operating an exhaust pump (not shown) connected to the exhaust duct 45, opening the gate valves 43 and 44, and driving the multistage axial flow turbine 6. The multistage axial flow turbine 6 is driven by a high frequency drive current output from the control unit 8. Rotation of the multistage axial flow turbine 6 is controlled by control unit 8 so that when there is a difference between the feedback signal $f_1$ and the control signal $f_3$, the difference is diminished.

Figure 8:
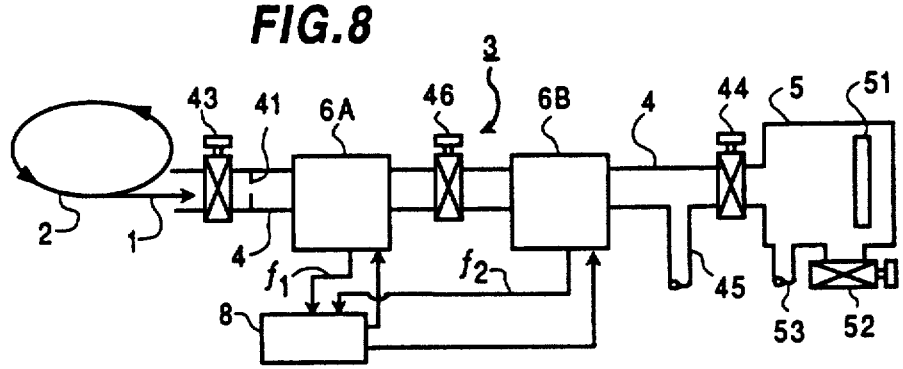
FIG. 8 is a schematic diagram of a second embodiment of irradiation equipment employing the present invention.

The second embodiment of the irradiation equipment employing the present invention is shown in FIG. 8. With reference to FIG. 8, the synchrotron radiation beam 1 from the synchrotron 2 is input into the left side of the irradiation equipment, and is applied to the work chamber 5 provided on the right side of the irradiation equipment. A target 51 for irradiation is disposed in work chamber 5. The irradiation equipment further comprises a beam duct 4, which forms a main vacuum path of the beam line 3. Two multistage axial flow turbines 6A and 6B are installed along the beam line. The high vacuum side of the beam duct 4 includes a gate valve 43 and an aperture plate 41. The low vacuum side of the beam duct includes a gate valve 44, which is connected to work chamber 5, and an exhaust duct 45. A gate valve 46 is inserted between multistage axial flow turbines 6A and 6B. As in the case of the first embodiment, there is no Be window. The gate valve 52 and an exhaust system (not shown) connected to exhaust duct 53 maintain a low vacuum in work chamber 5, for example about $10^{-1}$ to $10^{-2}$ Torr.

In the second embodiment, a higher vacuum in the synchrotron 2 ca be obtained than can be obtained in the first embodiment. This higher vacuum is obtained by opening gate valves 43 and 46, operating an exhaust system (not shown) connected to the exhaust duct 45 and driving the two multistage axial flow turbines 6A and 6B. In the second embodiment, the relative gap positions of two groups of rotor vanes 65 in the multistage axial flow turbines 6A and 6B may be aligned at all times during the operation. This arrangement permits the synchrotron radiation beam 1 to penetrate intermittently through the rotor gaps of the two multistage axial flow turbines. The feedback signals $f_1$ and $f_2$ from the two multistage axial flow turbines 6A and 6B are input to the first and second signal input terminals 82a and 82b, respectively, of the control unit 8. The two multistage axial flow turbines 6A and 6B are controlled by the control unit 8 so as to rotate in synchronization with each other, thereby permitting the synchrotron radiation beam to penetrate intermittently through two multistage axial flow turbine 6A and 6B.

In the above explanation of the second embodiment, the rotation of the two multistage axial flow turbines 6A and 6B is assumed to be in synchronization with each other. However, the rotation speed of the first multistage axial flow turbine 6A located on the high vacuum side can be precisely an integer multiple, for example twice or three times, of the rotation of the second multistage axial flow turbine 6B located on the low vacuum side. In this case, the two multistage axial flow turbines 6A and 6B are controlled by the control unit 8 so that the ratio of rotation speed of turbine 6A over that of turbine 6B is an integer. When the ratio of rotation speed is an integer, the synchrotron radiation beam 1 can penetrate intermittently through two multistage axial flow turbines. Driving the two multistage axial flow turbines 6A and 6B in this manner makes it possible to obtain a higher vacuum at the high vacuum side of the first multistage axial flow turbine 6A.

Figure 9:
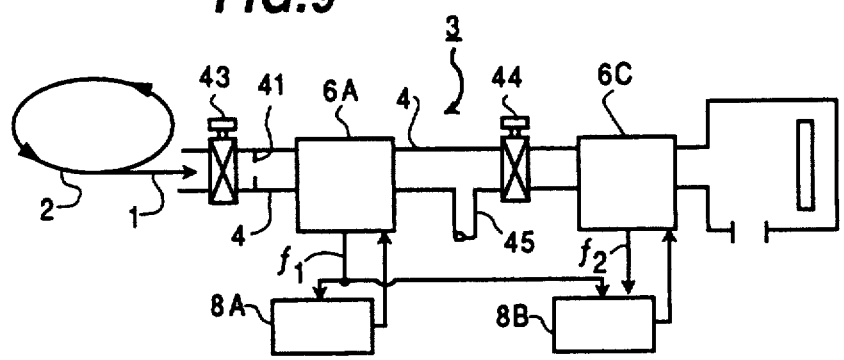
FIG. 9 is a schematic diagram of a third embodiment of irradiation equipment employing the present invention.

In the third embodiment employing the present invention, which is shown in FIG. 9, two multistage axial flow turbines 6A and 6C are utilized and the work chamber is at atmospheric pressure. On the high vacuum side of the beam duct 4, a gate valve 43 and an aperture plate 41 are provided. A gate valve 44 and an exhaust duct 45 are provided between multistage axial flow turbines 6A and 6C.

In the third embodiment, by adjusting gate valves 43 and 44, operating an exhaust system (not shown) connected to the exhaust duct 45 and driving the two multistage axial flow turbines 6A and 6C, a high vacuum is obtained in the synchrotron 2. Because the low vacuum side of the second multistage axial flow turbine 6C is directly exposed to the ambient atmosphere of the work chamber, the number of rotors and the size and shape of the vanes may be required to be different from those of the first multistage axial flow turbine 6A. Consequently, synchronization of gap positions for the two groups of rotors is more difficult to obtain. That is, it becomes more difficult to align the groups of rotor gaps in the third embodiment because the number of rotors and the size and shape of the vanes may be different for each of the two multistage axial flow turbines 6A and 6B.

In the third embodiment, the first and second multistage axial flow turbines 6A and 6C are controlled by control units 8A and 8B, respectively. Feedback signals $f_1$ and $f_2$, output from the multistage axial flow turbines 6A and 6C are input into control units 8A and 8B, respectively. Also, the feedback signal $f_1$ from the multistage axial flow turbine 6A is input to the control unit 8B, which synchronizes the second multistage axial flow turbine 6C with the first multistage axial flow turbine 6A. The work chamber 5 is directly connected to the multistage axial flow turbine 6C and there is no Be window to attenuate the synchrotron radiation beam 1.

In the third embodiment, as with the second embodiment, the rotation speed of the first multistage axial flow turbine 6A can be made an integer multiple, for example twice or three times, that of the second multistage axial flow turbine 6C. When the ratio of rotation speed of turbine 6A over that of turbine 6C is an integer, beam 1 penetrates intermittently through two multistage axial flow turbines 6A and 6C.

As described above, the irradiation equipment in accordance with the present invention comprises a multistage axial flow turbine installed along the beam line. A multistage axial flow turbine of the invention has plural stators and rotors, each having vanes and being arranged alternately in an axial direction. A beam transmission hole is formed in a vane region of each stator, and each transmission hole of the plural stators is aligned in the axial direction. Gaps are formed between adjacent vanes of each rotor, and the positions of gaps for plural rotors are aligned in the axial direction. When the beam transmission hole of each stator and the gaps of the rotors are aligned in the axial direction, the synchrotron radiation beam penetrates through the multistage axial flow turbine.

The exhaust efficiency of the irradiation equipment in accordance with the present invention is greater than that of existing irradiation equipment. Furthermore, the target for irradiation can be placed in the work chamber at a low vacuum of $10^{-1}$ to $10^{-2}$ Torr or atmospheric pressure without a Be window. Unlike existing irradiation equipment, the length of the beam line in accordance with the present invention can be shortened to less than 1 meter. Also, the irradiation equipment in accordance with the present invention applies synchrotron radiation effectively regardless of the wavelength of the synchrotron radiation. Still further, the irradiation equipment in accordance with the present invention can be easily handled.

What is claimed is:

1. Irradiation equipment for applying synchrotron radiation, one end of the irradiation equipment is coupled to a synchrotron, a work chamber is disposed at another end of the irradiation equipment and a synchrotron radiation beam is transmitted through the irradiation equipment, comprising:
   a first multistage axial flow turbine, comprising a plurality of stators and rotors arranged alternately in an axial direction, each of said stators having vanes and a beam transmission hole, each of said rotors having vanes and gaps between adjacent vanes, said beam transmission holes are aligned in a beam direction of the synchrotron radiation beam, and said gaps of adjacent rotors are aligned in said beam direction.

2. Irradiation equipment as recited in claim 1, further comprising:
   at least one of a gate valve and an aperture plate.

3. Irradiation equipment as recited in claim 2, wherein at least one of said gate valves and said aperture plates is operatively connected to a high vacuum side of said first multistage axial flow turbine, and an exhaust duct and at least one of said gate valves are operatively connected to a low vacuum side of said first multistage axial flow turbine.

4. Irradiation equipment as recited in claim 1, further comprising:
   a second multistage axial flow turbine including beam transmission holes aligned coincident with the synchrotron radiation beam; and
   at least one of a gate valve, an aperture plate and an exhaust duct.

5. An irradiation equipment of synchrotron radiation as recited in claim 4, wherein at least one of said gate valves and said aperture plates are operatively connected to high vacuum side of said first multistage axial flow turbine, and at least one of said exhaust ducts and said gate valves are operatively connected to a low vacuum side of said second multistage axial flow turbine.

6. Irradiation equipment as recited in claim 5, wherein said irradiation equipment further comprises:
   control means for controlling the movements of said first and second multistage axial flow turbines, said control means including a circuit means for maintaining synchronization between rotation of said first and second multistage axial flow turbines.

7. Irradiation equipment as recited in claim 4, wherein at least one of said gate valves and said aperture plate is operatively connected to a high vacuum side of said first multistage axial flow turbine, at least one of said exhaust ducts and said gate valves are operatively connected between said first and second multistage axial flow turbines, and a low vacuum side of said second multistage axial flow turbine is open to the atmosphere.

8. Irradiation equipment as recited in claim 7, wherein said irradiation equipment further comprises:
   control means for controlling the movements of said first and second multistage axial flow turbines, said control means including a circuit means for maintaining synchronization between rotation of said first and second multistage axial flow turbines.

9. Irradiation equipment as recited in claim 5, wherein said irradiation equipment further comprises:
   control means for controlling the movements of said first and second multistage axial flow turbines, said control means including a circuit means for maintaining the rotation speed of the first multistage axial flow turbine at an integral multiple of the rotation speed of the second multistage axial flow turbine.

10. Irradiation equipment as recited in claim 7, wherein said irradiation equipment further comprises:
    control means for controlling the movements of said first and second multistage axial flow turbines, said control means including a circuit means for maintaining the rotation speed of the first multistage axial flow turbine at an integral multiple of the rotation speed of the second multistage axial flow turbine.

11. Irradiation equipment as recited in claim 1, further comprising:
    a beam duct disposed along said beam direction and coupled to at least one of a high vacuum side of said first multistage axial flow turbine and a low vacuum side of said first multistage axial turbine.

12. Irradiation equipment as recited in claim 1, wherein said stators comprise:
    stator vanes defining vane regions and said beam transmission holes are formed in said vane regions.

13. Irradiation equipment as recited in claim 3, wherein said high vacuum side of first multistage axial flow turbine is operatively coupled to the synchrotron and said low vacuum side is operatively coupled to the work chamber.

14. Irradiation equipment as recited in claim 5, wherein said high vacuum side of said first multistage axial flow turbine is operatively coupled to the synchrotron and said low vacuum side of said second multistage axial flow turbine is operatively coupled to the work chamber.

15. Irradiation equipment as recited in claim 5, wherein at least one of said gate valves operatively coupled to said first and second multistage axial flow turbines.

16. Irradiation equipment as recited in claim 7, wherein said high vacuum side of said first multistage axial flow turbine is operatively coupled to said synchrotron and said low vacuum side of said second multistage axial flow turbine is operatively coupled to the work chamber.

17. Irradiation equipment for applying a synchrotron radiation beam, comprising:
    an axial flow turbine vacuum pump having a rotor and a stator; and
    transmission means for transmitting the synchrotron radiation beam through said rotor and said stator of said axial flow turbine vacuum pump.

18. Irradiation equipment as recited in claim 17, wherein said rotor of said axial flow turbine vacuum pump comprises:
    a plurality of vanes positioned to define gaps between adjacent vanes.

19. Irradiation equipment as recited in claim 18, wherein said transmission means includes:
    control means for controlling movements of said rotor and for intermittently aligning one of said gaps along the synchrotron radiation beam.

20. Irradiation equipment as recited in claim 17, wherein said stator of said axial flow turbine vacuum pump further comprises:
    a beam transmission hole formed therein, said beam transmission hole being aligned along the synchrotron radiation beam.

21. Irradiation equipment for applying a synchrotron radiation beam, comprising:
a multistage axial flow turbine connected to receive the synchrotron radiation beam.

22. Irradiation equipment as recited in claim 21, further comprising:
transmission means for transmitting the synchrotron radiation beam between an inlet and an outlet in said multistage axial flow turbine.

23. Irradiation equipment as recited in claim 22, wherein said multistage axial flow turbine comprises:
a stator having vanes; and
a rotor having vanes positioned to define gaps between adjacent vanes.

24. Irradiation equipment as recited in claim 23, wherein said stator includes a beam transmission hole formed therein, said beam transmission hole being aligned along the synchrotron radiation beam; and wherein said transmission means includes means for intermittently aligning said gaps with the radiation beam as the rotor rotates.

* * * * *